United States Patent
Okada et al.

(10) Patent No.: US 10,224,388 B2
(45) Date of Patent: Mar. 5, 2019

(54) WIRING CORE STRUCTURE, SEMICONDUCTOR EVALUATION DEVICE AND SEMICONDUCTOR DEVICE

(71) Applicant: Mitsubishi Electric Corporation, Tokyo (JP)

(72) Inventors: Akira Okada, Tokyo (JP); Masayoshi Hirao, Fukuoka (JP); Kazushige Matsuo, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 70 days.

(21) Appl. No.: 14/714,045

(22) Filed: May 15, 2015

(65) Prior Publication Data

US 2016/0054376 A1 Feb. 25, 2016

(30) Foreign Application Priority Data

Aug. 25, 2014 (JP) ................. 2014-170114

(51) Int. Cl.
*H01L 23/00* (2006.01)
*H01L 49/02* (2006.01)
(Continued)

(52) U.S. Cl.
CPC ............ *H01L 28/10* (2013.01); *H01F 3/14* (2013.01); *H01F 17/062* (2013.01);
(Continued)

(58) Field of Classification Search
None
See application file for complete search history.

(56) References Cited

U.S. PATENT DOCUMENTS 2,856,581 A * 10/1958 Alldredge .............. G01R 33/05
  324/253
3,262,027 A * 7/1966 Zaleske ............... F16K 31/0675
  251/129.15

(Continued)

FOREIGN PATENT DOCUMENTS

CN 101697305 A 4/2010
JP 2001-313216 A 11/2001

OTHER PUBLICATIONS

An Office Action issued by the SIPO dated Feb. 15, 2017, which corresponds to Chinese Patent Application No. 201510527138.1 and and is related to U.S. Appl. No. 14/714,045; with partial English language translation.

*Primary Examiner* — Paresh H Patel

(74) *Attorney, Agent, or Firm* — Studebaker & Brackett PC

(57) ABSTRACT

A wound wire is wound around a core assembly so that both ends are short-circuited. In a coupling pin insertion state in which a coupling pin is inserted in a through hole of the core assembly, outer-peripheral space parts of respective divided core portions of the core assembly are disposed so as to overlap in plan view. Consequently, an air gap is formed in a part of a side surface of the core assembly. Before formation of a covering member, a main wire is caused to pass through the air gap and is thus disposed in a wiring hole of the core assembly. Then, the covering member for closing the air gap is provided on an outer peripheral surface side of the core assembly including the air gap so that a core structure is obtained.

3 Claims, 13 Drawing Sheets

(51) Int. Cl.
H01F 27/32 (2006.01)
H01F 3/14 (2006.01)
H01F 17/06 (2006.01)
H01L 23/64 (2006.01)
H01L 25/07 (2006.01)

(52) U.S. Cl.
CPC .......... H01F 27/325 (2013.01); *H01L 23/645* (2013.01); *H01L 24/45* (2013.01); *H01L 24/48* (2013.01); *H01L 25/072* (2013.01); *H01L 2224/45124* (2013.01); *H01L 2224/48091* (2013.01); *H01L 2224/48137* (2013.01); *H01L 2224/48227* (2013.01); *H01L 2924/10253* (2013.01); *H01L 2924/1203* (2013.01); *H01L 2924/13055* (2013.01)

(56) References Cited

U.S. PATENT DOCUMENTS

| | | | | |
|---|---|---|---|---|
| 4,897,561 A | * | 1/1990 | Saigo | H03H 7/46 307/413 |
| 4,929,903 A | * | 5/1990 | Saigo | G01R 31/021 324/521 |
| 5,117,191 A | * | 5/1992 | Saigo | G01R 31/1272 324/529 |
| 5,173,678 A | * | 12/1992 | Bellows | H01F 6/06 29/606 |
| 5,706,575 A | * | 1/1998 | Kaufman | G01R 33/383 29/416 |
| 6,060,972 A | * | 5/2000 | Van Den Brink | H01F 17/062 324/127 |
| 6,380,735 B1 | * | 4/2002 | Kawakami | G01R 33/02 324/253 |
| 6,984,979 B1 | * | 1/2006 | Edel | G01R 15/185 324/253 |
| 7,812,702 B2 | | 10/2010 | Mano et al. | |
| 7,843,302 B2 | | 11/2010 | Mano et al. | |
| 7,855,626 B2 | | 12/2010 | Mano et al. | |
| 7,868,728 B2 | | 1/2011 | Mano et al. | |
| 8,207,811 B2 | | 6/2012 | Mano et al. | |
| 9,030,210 B2 | * | 5/2015 | Watanabe | G01R 31/025 324/551 |
| 9,424,984 B2 | * | 8/2016 | Ludois | H01F 27/40 |
| 2003/0222747 A1 | * | 12/2003 | Perkinson | H01F 38/30 336/178 |
| 2007/0257761 A1 | | 11/2007 | Mano et al. | |
| 2007/0262839 A1 | * | 11/2007 | Bosley | H01F 27/255 335/297 |
| 2009/0224863 A1 | | 9/2009 | Mano et al. | |
| 2009/0225525 A1 | | 9/2009 | Mano et al. | |
| 2010/0117779 A1 | | 5/2010 | Mano et al. | |
| 2011/0102122 A1 | | 5/2011 | Mano et al. | |
| 2013/0000795 A1 | * | 1/2013 | Nakanoue | C21D 1/26 148/526 |
| 2014/0232505 A1 | | 8/2014 | Ueno et al. | |

* cited by examiner

WIRING CORE STRUCTURE, SEMICONDUCTOR EVALUATION DEVICE AND SEMICONDUCTOR DEVICE

BACKGROUND OF THE INVENTION

Field of the Invention

The present invention relates to a wiring core structure provided in a wiring region where a parasitic inductance is to be suppressed in a large current circuit, a high frequency circuit and the like, that is, a wiring region to be a parasitic-inductance suppression target.

Description of the Background Art

In a large current circuit and a high frequency circuit, it is necessary to reduce a wiring parasitic L (inductance). An inductance L of a wiring cable, an applied current I, and a magnetic flux $\phi$ generated around the wiring cable have a relationship of $\{L=\phi/1\}$.

In other words, the wiring parasitic L is caused by the magnetic flux generated around a wire. As a countermeasure to be taken against the wiring parasitic L, conventionally, the wiring is shortened as greatly as possible. Alternatively, a method using a twisted wire, a parallel plate or the like is utilized to cancel the magnetic flux.

Moreover, in order to suppress the wiring parasitic L, Japanese Patent Application Laid-Open No. 2001-313216 or the like discloses a noise-current absorbing tool that surrounds an outer peripheral part of a wire to absorb a noise getting in/out of an electric wire through an external environment.

However, a wiring physically needs a length to some degree. Moreover, a magnetic flux cannot be perfectly cancelled by using a twisted wire or a parallel plate. For this reason, a large current circuit or a high frequency circuit still has a problem of the wiring parasitic L. In addition, a conventional noise current absorber has a disadvantage in that the problem of the wiring parasitic L cannot be solved sufficiently.

SUMMARY OF THE INVENTION

It is an object of the present invention to provide a wiring core structure capable of suppressing a wiring parasitic L (inductance) more effectively, and a semiconductor evaluation device and a semiconductor device which use the wiring core structure.

The wiring core structure according to the present invention includes a tubular-shaped core portion and a wound wire. The core portion includes a wiring hole for passage of a main wire to be a parasitic-inductance suppression target and has a body portion made of a soft magnetic material. The wound wire is formed by winding the wire around the core portion and has both ends short-circuited.

The core portion includes a plurality of divided core portions which are disposed in a superposed relation and each have a wiring hole. The divided core portions are formed such that shapes of the wiring holes and outside diameters of body portions are different from each other. Consequently, there is implemented a superposition structure without overlapping in plan view.

The wiring core structure according to the present invention produces an inductance suppression effect for reducing a parasitic inductance of a main wire by utilizing the principle of a transformer in which a main wire is set to be a primary cable and a wound wire is set to be a secondary cable in the case where a current flows to the main wire.

In this case, in the plurality of divided core portions, the shapes (diameters or the like) of the wiring holes, and the outer diameters (diameters of outermost peripheral portions) of body portions are made different from each other. Thus, by changing a combination of superposition structures between the plurality of divided core portions depending on a thickness of the main wire, it is possible to efficiently decrease a magnetic flux to be generated around the main wire.

These and other objects, features, aspects and advantages of the present invention will become more apparent from the following detailed description of the present invention when taken in conjunction with the accompanying drawings.

DESCRIPTION OF THE PREFERRED EMBODIMENTS

<Principle of the Invention>

Figure 1:
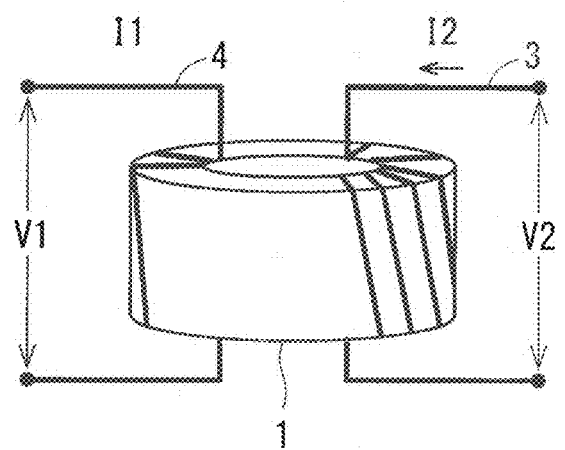
FIG. 1 is an explanatory view showing a configuration of a general transformer.
Figure 2:
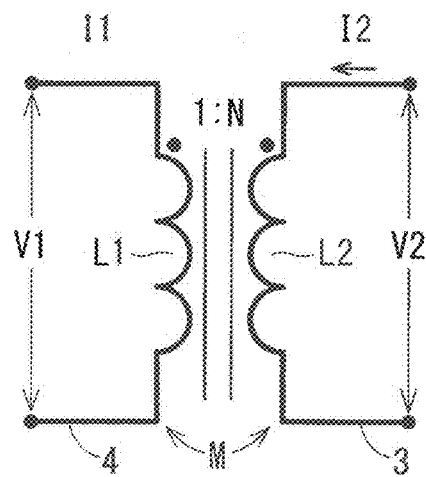
FIG. 2 is an equivalent circuit diagram showing the transformer shown in FIG. 1.

The present invention utilizes a characteristic of a transformer. First of all, the characteristic of the transformer will be described. FIG. 1 is an explanatory view showing a configuration of a general transformer and FIG. 2 is a circuit diagram showing an equivalent circuit of the transformer shown in FIG. 1.

As shown in these drawings, a primary voltage V1 and a secondary voltage V2 are obtained from a primary input terminal (a left side in the drawing) and a secondary output terminal (a right side in the drawing). In these drawings, a ratio of a mutual conductance M to the numbers of turns of inductances L1 and L2 are set to be 1 to N between a primary current I1 and an inductance L1 at a primary side and a secondary current I2 and an inductance L2 at a secondary side.

The primary voltage V1 and the secondary voltage V2 are expressed by the following equations (1) and (2).

[Equation 1]

$$V1 = L1 \cdot dI1/dt + M \cdot dI2/dt \quad (1)$$

[Equation 2]

$$V2 = M \cdot dI1/dt + L2 \cdot dI2/dt \quad (2)$$

Moreover, a relationship between the primary voltage V1 and the secondary voltage V2 is derived from the following equations (3) and (4).

[Equation 3]

$$L1 \cdot L2 = M^2 \quad (3)$$

[Equation 4]

$$V1 = L1 \cdot dI1/dt + M \cdot dI2/dt = L1/M(M \cdot dI1/dt + L2 \cdot dI2/dt)$$
$$= L1/M \times V2 \quad (4)$$

If the secondary output terminal is short-circuited, the secondary voltage is V2=0V so that V1=0V is obtained.

On the other hand, energy PM to be stored in the transformer is expressed by {PM=V1·I1+V2·I2}. When the secondary side is short-circuited, {V1=V2=0V} is set so that {PM=0 W} is obtained. In other words, it means that the energy is not stored in the transformer when the secondary side is short-circuited.

In the meantime, energy of a magnetic field per unit volume is proportional to a square of a magnetic flux density. Accordingly, the energy to be stored in the transformer is 0 W so that a magnetic flux generated in a core is also 0 Wb.

Thus, when a secondary output of the transformer is short-circuited, the secondary current I2 flows to cancel the magnetic flux in the core also in the case where the primary current I1 is caused to flow to the primary side. For this reason, the magnetic flux is not generated in the core.

The present invention utilizes the characteristic of the transformer.

<Technical Premise>

Figure 3A:
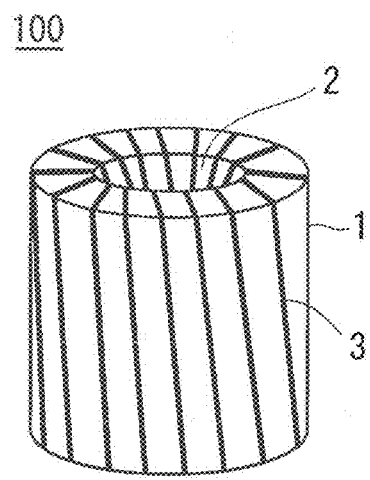
FIGS. 3A and 3B are explanatory views (Part 1) showing a core structure to be the technical premise of the present invention.
Figure 3B:
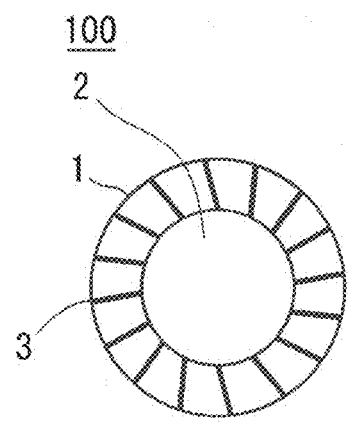
Figure 4:
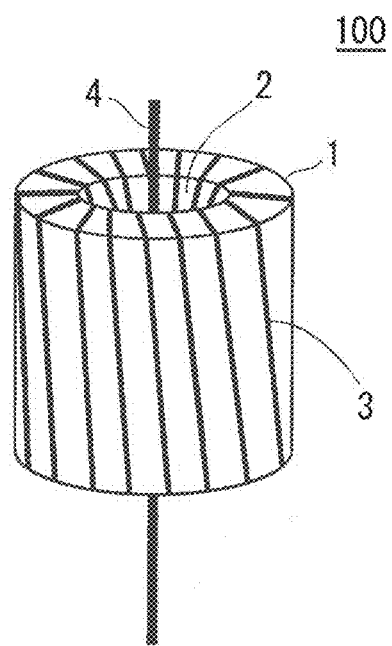
FIG. 4 is an explanatory view (Part 2) showing the core structure to be the technical premise of the present invention.

FIGS. 3A and 3B and FIG. 4 are explanatory views each showing a (wiring) core structure 100 to be the technical premise according to the present invention. As shown in these drawings, the core structure 100 is constituted (formed) of a tubular-shaped core portion 1 including a wiring hole 2 for passage of a main wire 4 to be a parasitic-inductance suppression target and a body portion (a substantial part in which the wiring hole 2 is to be formed) made of a soft magnetic material, and a wound wire 3 formed by winding the wire around a side surface of the core portion 1 and having both ends short-circuited. As shown in FIG. 4, the core portion 1 is disposed such that the main wire 4 passes through an inner part of the wiring hole 2. Thus, the core structure 100 is used.

With this configuration, when a current is caused to flow to the main wire 4 serving as a primary cable, a magnetic flux is generated around the main wire 4. However, according to the characteristic of the transformer, the current flows through the core portion 1 so as to cancel the magnetic flux in the wound wire 3 serving as a secondary cable. For this reason, the magnetic flux is not generated. In other words, the magnetic flux is not generated in the care portion 1. Correspondingly, the generation of the magnetic flux is decreased. Thus, a parasitic L resulting from the main wire 4 is reduced.

Thus, by utilizing the characteristic of the transformer, the parasitic L resulting from the main wire 4 is reduced in wiring core structures (core structures 10, 20, 30A to 30D, 40, 60A to 60C and 80) which will be described in the following first to seventh preferred embodiments.

First Preferred Embodiment

Figure 5:
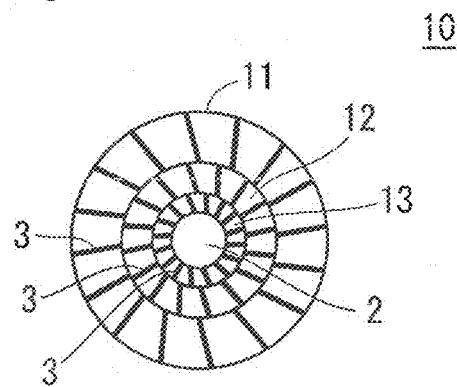
FIG. 5 is a plan view showing a wiring core structure according to a first preferred embodiment of the present invention.

FIG. 5 is a plan view showing the (wiring) core structure 10 according to the first preferred embodiment of the present invention. As shown in FIG. 5, a core portion in the core structure 10 according to the first preferred embodiment is made up of an assembly of a plurality of divided core portions 11 to 13, each of which has a wiring hole. The divided core portions 11 to 13 can be superposed on one another and disposed so as not to overlap in plan view.

Each of the divided core portions 11 to 13 has a wiring hole 2 for passage of a main wire 4 to be a parasitic-inductance suppression target, and has a tubular-shaped (cylindrical) body portion made of a soft magnetic material having a high magnetic permeability, for example, ferrite in the same manner as the core portion 1 according to the technical premise shown in FIGS. 3A and 3B and FIG. 4. Then, the core structure 10 is provided with a wound wire 3 which is formed by winding the wire around each of the divided core portions 11 to 13 and has both ends short-circuited.

However, the core structure 10 according to the first preferred embodiment features that the divided core portions 11 to 13 are formed such that inside diameters (diameters of wiring holes defining shapes of the wiring holes) and outside diameters of the body portions (diameters of outermost peripheral parts) are different from each other. More specifically, the divided core portion 11 has the diameter of the wiring hole 2 which is the largest and is slightly larger than the outside diameter of the body portion of the divided core portion 12, and the divided core portion 12 has the diameter of the wiring hole 2 which is large and is slightly larger than the outside diameter of the body portion of the divided core portion 13. Accordingly, the outside diameter of the body portion is also reduced in order of the divided core portion 11, the divided core portion 12 and the divided core portion 13, and the wiring hole 2 of the divided core portion 13 is a minimum wiring hole in the core structure 10 having the smallest diameter.

Accordingly, the core structure 10 according to the first preferred embodiment has a superposition structure without overlapping in plan view in which the divided core portion 12 can be disposed in the wiring hole 2 of the divided core portion 11 and the divided core portion 13 can be disposed in the wiring hole 2 of the divided core portion 12.

In general, a magnetic flux generated around a main circuit increases in density in a closer place to a wire and decreases in density with the distance from the wire. Thus, in order to reduce a parasitic L resulting from the main wire 4, it is necessary to decrease the magnetic flux to be generated in the vicinity of the main wire 4 as greatly as possible. With the core structure 10 according to the first preferred embodiment, if the wiring hole 2 is large with respect to a cable serving as the main wire 4, comparatively large clearance is formed between the main wire 4 and the core portion so that the magnetic flux cannot be decreased efficiently. Thus, by preparing the divided core portions 11 to 13 in which the diameters of the wiring holes 2 and the outside diameters of the body portions are different from each other and changing the combination of the superposition structures depending on a thickness of the cable serving as the main wire 4, it is possible to produce an advantage that the magnetic flux to be generated around the main wire 4 can be decreased efficiently.

For example, in the case where the thickness of the main wire 4 is small, all of the divided core portions 11 to 13 are used in a superposed relation, and the main wire 4 is disposed in the wiring hole 2 of the divided core portion 13. In the case where the thickness of the main wire 4 has a middle degree (is greater than the wiring hole 2 of the divided core portion 13), the two divided core portions 11 and 12 except for the divided core portion 13 are used in a superposed relation, and the main wire 4 is disposed in the wiring hole 2 of the divided core portion 12. In the case where the thickness of the main wire 4 is greater than the wiring hole 2 of the divided core portion 12, the divided core portion 11 is used alone, and the main wire 4 can be disposed in the wiring hole 2 of the divided core portion 11.

Thus, the core structure 10 according to the first preferred embodiment has an inductance suppressing effect for reducing the parasitic inductance of the main wire 4 by utilizing the principle of a transformer in which the main wire 4 is set to be a primary cable and the wound wire 3 is set to be a secondary cable in the case where a current flows to the main wire 4.

Furthermore, in the core structure 10 according to the first preferred embodiment, the diameters of the wiring holes and the outside diameters of the body portions are made different from each other in the divided core portions 11 to 13 (the plurality of divided core portions). Thus, by changing the combination of the superposition structures depending on the thickness of the main wire 4, it is possible to efficiently decrease the magnetic flux to be generated around the main wire.

Second Preferred Embodiment

Figure 6:
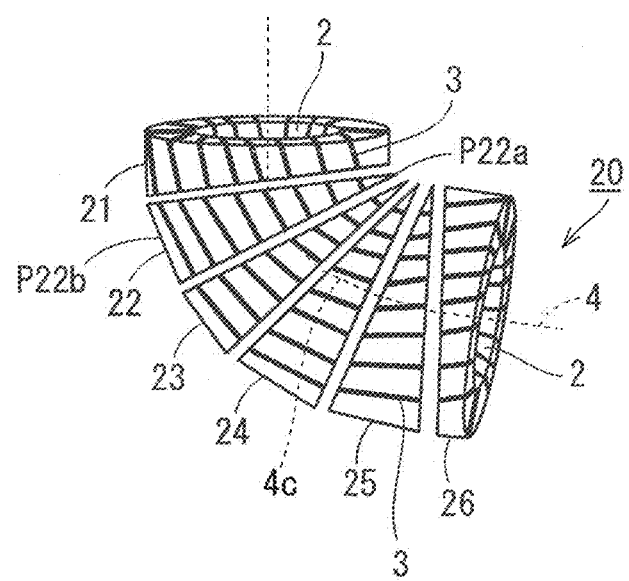
FIG. 6 is an explanatory view showing a wiring core structure according to a second preferred embodiment of the present invention.

FIG. 6 is an explanatory view showing a (wiring) core structure 20 according to a second preferred embodiment of the present invention. As shown in FIG. 6, a core portion in the core structure 20 according to the second preferred embodiment is made up of an assembly of a plurality of divided core portions 21 to 26 which are stacked on one another and disposed and each have a wiring hole.

Each of the divided core portions 21 to 26 has a wiring hole 2 for passage of a main wire 4 to be a parasitic-inductance suppression target and has a body portion made of a soft magnetic material in the same manner as the core portion 1 according to the technical premise shown in FIGS. 3A and 3B and FIG. 4. Then, the core structure 20 is provided with a wound wire 3 which is formed by winding the wire around each of the divided core portions 21 to 26 and has both ends short-circuited.

However, with the core structure 20 according to the second preferred embodiment, the main wire 4 having a curved (or bent) portion 4c partially is set to be a parasitic-inductance suppression target, and the wiring hole 2 of the core structure 20 (the whole divided core portions 21 to 26) is provided for passage of the curved portion 4c.

For this reason, each of the divided core portions 21 to 26 (particularly, the divided core portions 22 to 25) forming the core portion of the core structure 20 features to be a deformed and divided core portion having an obliquely sectional shape in which an interval between an upper surface (an upper side in the drawing) and a lower surface (a lower side in the drawing) is monotonously changed between both opposite ends (for example, ends P22a and P22b of the divided core portion 22) of the body portion in plan view (as seen in a plane where a circular shape including the wiring hole 2 is formed). The "obliquely sectional shape" represents such a shape that at least one of the upper surface and the lower surface is a surface obtained by obliquely cutting a cylindrical object (which corresponds to a surface referred to as a "Sogi" of the New Year's decorative pine trees).

Figure 7:
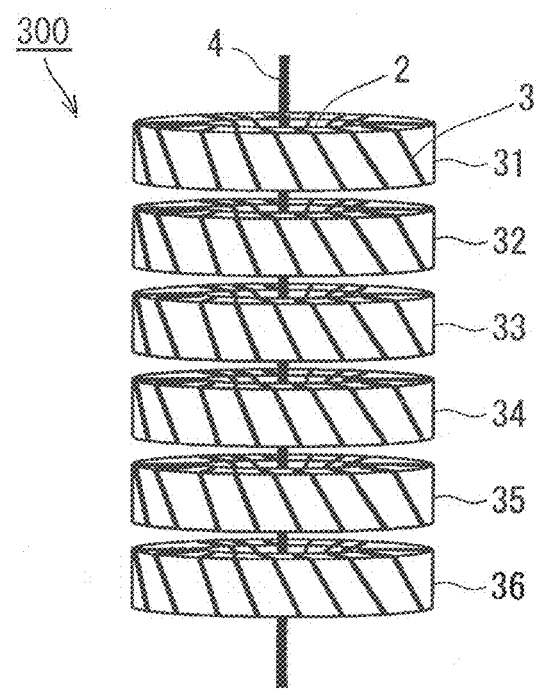
FIG. 7 is an explanatory view showing a wiring core structure for comparison with the second preferred embodiment.

FIG. 7 is an explanatory view showing a (wiring) core structure 300 for comparison with the second preferred embodiment. As shown in FIG. 7, a core portion in the core structure 300 is made up of an assembly of a plurality of divided core portions 31 to 36 which are stacked on one another and disposed in a vertical direction, and each have a wiring hole 2.

Each of the divided core portions 31 to 36 has the wiring hole 2 for passage of a main wire 4 to be a parasitic-inductance suppression target, and has a body portion made of a soft magnetic material and formed into a tubular shape in the same manner as the core portion 1 according to the technical premise shown in FIGS. 3A and 3B and FIG. 4. Then, the core structure 300 is provided with a wound wire 3 which is formed by winding the wire around a side surface of each of the divided core portions 31 to 36 and has both ends short-circuited.

In the case of the stacking structure of the tubular-shaped divided core portions 31 to 36 as in the core structure 300 shown in FIG. 7, comparatively large clearance is formed among the divided core portions 31 to 36 when they are disposed corresponding to the curved portion 4c of the main wire 4 shown in FIG. 6. In the clearance part, a magnetic flux is not cancelled but left.

On the other hand, in the core structure 20 according to the second preferred embodiment, each of the divided core portions 21 to 26 is formed into an obliquely sectional shape. Consequently, corresponding to a bent state of a cable serving as the main wire 4, a whole or part of the divided core portions 21 to 26 can be disposed in combination such that clearance is not formed as much as possible.

Thus, at least one of the divided core portions 21 to 26 (the plurality of divided core portions) includes a deformed and divided core portion having an obliquely sectional shape. Consequently, it is possible to reduce the interval among the divided core portions 21 to 26 with respect to the curved portion 4c of the main wire 4. Accordingly, it is possible to produce an effect for enhancing an inductance suppressing effect more greatly.

Third Preferred Embodiment (First Mode)

Figure 8:
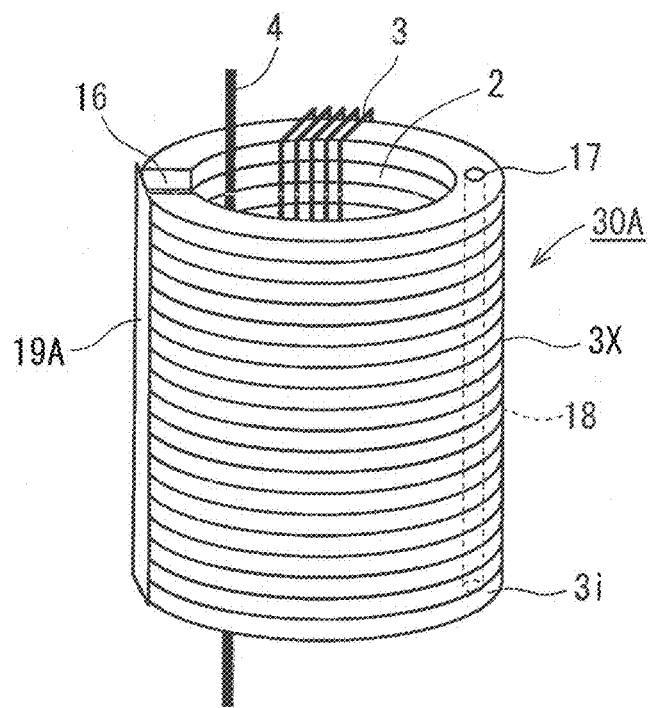
FIG. 8 is an explanatory view showing a wiring core structure according to a first mode of a third preferred embodiment of the present invention.

FIG. 8 is an explanatory view showing a (wiring) core structure 30A according to a first mode of a third preferred embodiment of the present invention. As shown in FIG. 8, a core portion in the core structure 30A according to the third preferred embodiment is a tubular-shaped core portion made up of a core assembly 3X of a plurality of divided core portions 3i each of which is a plate-shaped core. The divided core portions 3i are stacked and disposed without clearance between the respective divided core portions in a vertical direction, each have a wiring hole 2, and are made of a soft magnetic material having a high magnetic permeability, for example, ferrite. The respective divided core portions 3i have planar shapes (shapes of the wiring holes 2 and outside diameters of body portions) set to be identical.

In the same manner as the core structure 300 shown in FIG. 7, each of the divided core portions 3i has the wiring hole 2 for passage of a main wire 4 to be a parasitic-inductance suppression target and has the body portion made of a soft magnetic material. Then, the core structure 30A is provided with a wound wire 3 which is formed by winding the wire around the core assembly 3X and has both ends short-circuited.

The divided core portion 3i in the core structure 30A according to the third preferred embodiment has an outer-peripheral space part, provided in the body portion (a substantial part around the wiring hole 2), for inserting the main wire 4 into the wiring hole 2 at a side-surface side of the body portion (a space for forming an air gap 16), and a through hole 17, provided on the body portion, for causing a common coupling pin 18 to penetrate between the divided core portions 3i of the core assembly 3X.

In the core structure 30A, the coupling pin 18 is inserted into the through hole 17 provided on the core assembly 3X so that the plurality of divided core portions 3i are integrated as the core assembly 3X in a coupling pin insertion state. Then, the core assembly 3X is fixed. The fixation of the core assembly 3X is carried out by using a method such as calking or bonding.

Thereafter, it is possible to short-circuit both ends by the wound wire 3 wound around the core assembly 3X as described above.

On the other hand, in the coupling pin insertion state, the outer-peripheral space parts of the divided core portions 3i of the core assembly 3X are disposed so as to overlap (coincide) in plan view. Consequently, an air gap 16 (a side-surface space region defined by an assembly of the outer-peripheral space parts) is formed in a part of the side surface of the core assembly 3X to be the core portion.

Before formation of a covering member 19A, the main wire 4 is caused to pass through the air gap 16 so that the main wire 4 is disposed in the wiring hole 2 of the core assembly 3X, and then, the covering member 19A serving as a closing member for closing the air gap 16 is provided on the outer peripheral surface side of the core assembly 3X including the air gap 16. The covering member 19A is made of a soft magnetic material having a high magnetic permeability. Although the covering member 19A is fixed by methods such as fitting and screwing, the present invention is not restricted to these fixing methods. Moreover, a sheet-like magnetic shielding material may be stuck as the covering member 19A.

The covering member 19A implements a closing structure that prevents the main wire 4 inserted into the wiring hole 2 from being removed toward the outside of the wiring hole 2 through the air gap 16.

Thus, with the core structure 30A according to the first mode of the third preferred embodiment, in a previous stage to the formation of the covering member 19A, the core assembly 3X (the plurality of divided core portions 3i) is disposed to have an opening structure in which the main wire 4 can be inserted into the wiring hole 2 through the air gap 16 defined by the assembly of the outer-peripheral space parts of the body portions of the respective divided core portions 3i, and the main wire 4 is inserted into the wiring hole 2 through the air gap 16. Consequently, the main wire 4 can be disposed in the wiring hole 2 comparatively easily.

The core structure 30A can exhibit the inductance suppressing effect for the main wire 4 with high stability by the closing of the air gap 16 using the covering member 19A.

Thus, after the main wire 4 is disposed in the wiring hole 2 with respect to the core assembly 3X in the coupling pin insertion state, the covering member 19A serving as a closing member is provided. Consequently, in the coupling pin insertion state, the core assembly 3X can be changed from the opening state having the air gap 16 to the closing state.

For example, in the case where the core structure 300 shown in FIG. 7 is utilized for the main wire 4 which has already been connected to a device, it is necessary to once detach one of ends of the main wire 4 from the device, and to then insert the end into the wiring hole 2 of the core structure 300. Consequently, workability is poor.

On the other hand, in the core structure 30A according to the third preferred embodiment, the main wire 4 serving as a primary cable is inserted through the air gap 16 into the wiring hole 2 before the formation of the covering member 19A, and then the covering member 19A can be provided. Thus, it is possible to considerably improve workability in the case where the core structure 30A is formed and used.

Furthermore, according to the first mode of the third preferred embodiment, the covering member 19A can prevent the magnetic flux generated from the main wire 4 from leaking to the outside of the core structure 30A.

(Second Mode)

Figure 9:
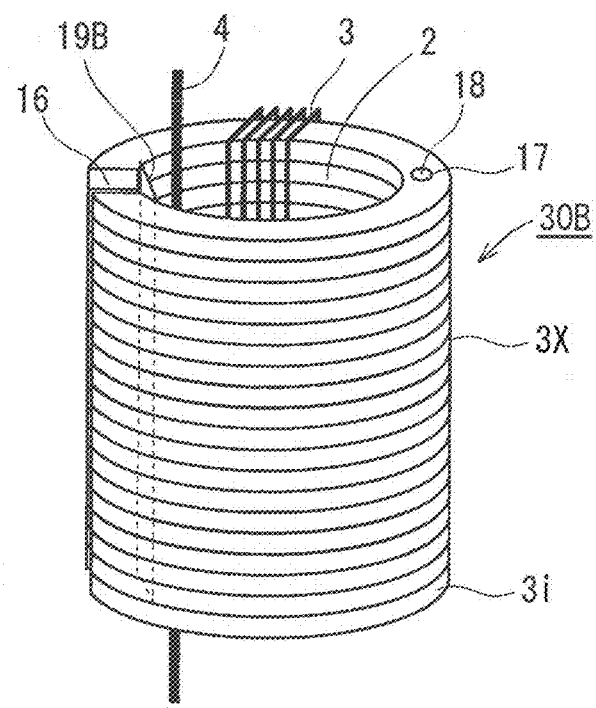
FIG. 9 is an explanatory view showing a wiring core structure according to a second mode of the third preferred embodiment of the present invention.

FIG. 9 is an explanatory view showing a structure of a (wiring) core structure 30B according to a second mode of the third preferred embodiment of the present invention. The core structure 30B shown in FIG. 9 is implemented in the following manner: a main wire 4 is passed through an air gap 16 and is thus disposed in the main wire 4 in a wiring hole 2 of a core assembly 3X before formation of a covering member 19B serving as a closing member for closing the air gap 16, and then the covering member 19B is provided on an inner peripheral surface side of the core assembly 3X including the air gap 16. Since the other configurations, an inductance suppressing effect, a workability improving effect and the like are the same as those in the core structure 30A according to the first mode shown in FIG. 8, description thereof will be omitted.

According to the second mode of the third preferred embodiment, the covering member 19B can prevent a magnetic flux (a noise) generated on the outside from leaking into a core portion (a wiring hole).

(Third Mode)

Figure 10:
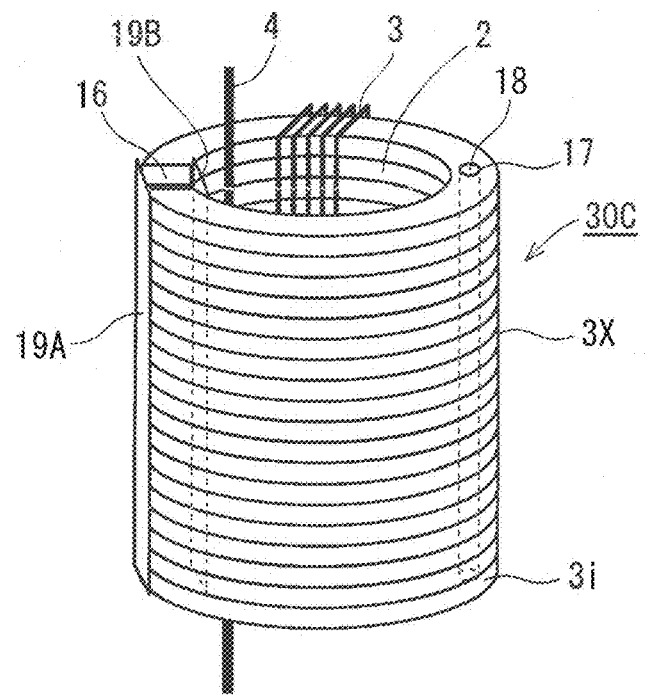
FIG. 10 is an explanatory view showing a wiring core structure according to a third mode of the third preferred embodiment of the present invention.

FIG. 10 is an explanatory view showing a structure of a (wiring) core structure 30C according to a third mode of the third preferred embodiment of the present invention. In the core structure 30C shown in FIG. 10, a main wire 4 is passed through an air gap 16 and is thus disposed in the main wire 4 in a wiring hole 2 of a core assembly 3X before formation of a covering member 19C, and then a covering member 19A and a covering member 19B, which each serve as a closing member for closing the air gap 16, are respectively provided on outer and inner peripheral surface sides of the core assembly 3X including the air gap 16. Since the other configurations, an inductance suppression effect, a workability improving effect and the like are the same as those in the core structure 30A shown in FIG. 8, description thereof will be omitted.

According to the third mode of the third preferred embodiment, the covering members 19A and 19B can prevent a magnetic flux generated from the main wire 4 from leaking to the outside of the core structure 30C.

Fourth Preferred Embodiment

Figure 11:
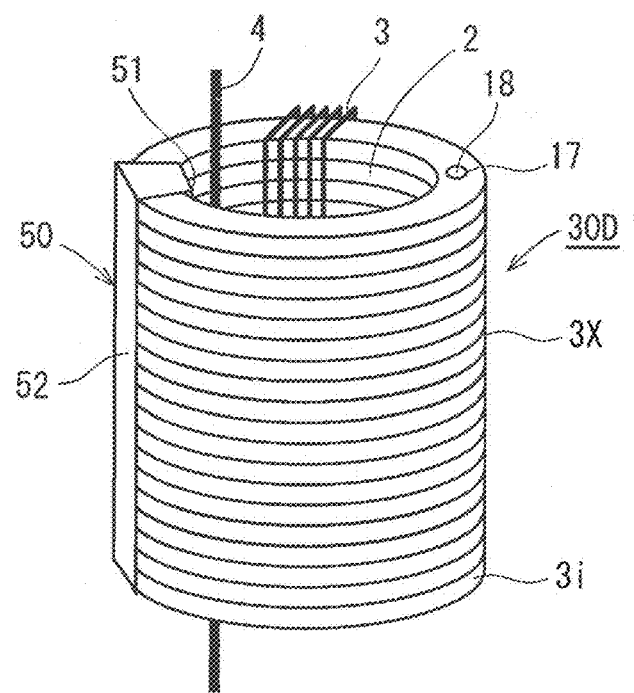
FIG. 11 is an explanatory view showing a wiring core structure according to a fourth preferred embodiment of the present invention.

FIG. 11 is an explanatory view showing a (wiring) core structure 30D according to a fourth preferred embodiment of the present invention. As shown in FIG. 11, a core portion in the core structure 30D according to the fourth preferred embodiment is a tubular-shaped core portion is made up of a core assembly 3X of a plurality of divided core portions 3i each of which is a plate-shaped core. The divided core portions 3i are stacked and disposed without clearance between the respective divided core portions in a vertical direction, each have a wiring hole 2, and are made of a soft magnetic material having a high magnetic permeability, for example, ferrite. The respective divided core portions 3i have planar shapes (diameters of the wiring holes 2 and outside diameters of body portions) set to be identical.

Since a wound wire 3, an air gap 16 (not shown in FIG. 11), a through hole 17, a coupling pin 18 and the like are the same as those of the first to third modes of the third preferred embodiment shown in FIGS. 8 to 10, description thereof will be omitted.

In a coupling pin insertion state, outer-peripheral space parts of the respective divided core portions 3i in the core assembly 3X are disposed so as to overlap in plan view. Thus, the air gap 16 to be a side-surface space region (an assembly of the outer-peripheral space parts) is formed on a part of a side surface of the core assembly 3X forming the core portion.

First of all, a main wire 4 is passed through the air gap 16 and is thus disposed in the wiring hole 2 of the core assembly 3X before formation of a cap portion 50, and then the cap portion 50 to be a click portion is fitted in the air gap 16 of the core assembly 3X. Consequently, the core structure 30D is formed. The cap portion 50 is constituted of a body portion 51 and a soft-magnetic-material surface portion 52. The body portion 51 has flexibility and is formed into such a shape as to conform to the air gap 16. For example, in the case where the air gap 16 is formed into a trapezoidal shape in plan view, in which an inside (the wiring hole 2 side) is set to be a short side, the body portion 51 is also formed into a trapezoidal shape in plan view, in which an inside is set to be a short side.

Furthermore, the cap portion 50 (the body portion 51) has flexibility. Thus, the cap portion 50 fitted in the air gap 16 can be removed comparatively easily. In other words, the cap portion 50 can be removable from the air gap 16.

For example, in the case where the core structure 300 shown in FIG. 7 is utilized for the main wire 4 which has already been connected to a device, it is necessary to once detach one of ends of the main wire 4 from the device, and to then insert the end into the wiring hole 2 of the core structure 300. Consequently, workability is poor.

On the other hand, in the core structure 30D according to the fourth preferred embodiment, the main wire 4 serving as a primary cable is inserted through the air gap 16 into the wiring hole 2 before the formation of the cap portion 50, and then the cap portion 50 for closing the air gap 16 can be provided. Thus, it is possible to considerably improve workability when the core structure 30D is formed and used.

The soft-magnetic-material surface portion 52 made of a soft magnetic material having a high magnetic permeability is formed on a surface of the cap portion 50 along an outer peripheral surface of the core structure 30D. Although the body portion 51 is desirably made of a flexible material, and may be obtained by bending a metal plate or may be made of a resin material, the present invention is not restricted thereto.

The cap portion 50 serving as the closing member for closing the air gap 16 implements a closing structure that prevents the main wire 4 inserted in the wiring hole 2 from being removed toward the outside of the wiring hole 2 through the air gap 16.

Thus, with the core structure 30D according to the fourth preferred embodiment, in a previous stage to the formation of the cap portion 50, the core assembly 3X (the plurality of divided core portions 3i) is disposed to have an opening structure in which the main wire 4 can be inserted into the wiring hole 2 through the air gap 16 defined by the assembly of the outer-peripheral space parts of the body portions of the respective divided core portions 3i, and the main wire 4 is inserted into the wiring hole 2 through the air gap 16. Consequently, the main wire 4 can be disposed in the wiring hole 2 comparatively easily.

The cap portion 50 is fitted in the air gap 16 so that the structure of the core assembly 3X is set into the closing structure. Consequently, it is possible to exhibit the inductance suppression effect for the main wire 4 with high stability.

Moreover, after the main wire 4 is disposed in the wiring hole 2 with respect to the core assembly 3X in the coupling pin insertion state, the cap portion 50 serving as a closing member is fitted in the air gap 16. Consequently, the core assembly 3X can be changed comparatively easily from the opening structure having the air gap 16 to the closing structure. For this reason, it is possible to produce the same workability improving effect as that in the third preferred embodiment.

Furthermore, the cap portion 50 according to the fourth preferred embodiment can be removable from the air gap 16. Correspondingly, it is possible to enhance the workability more greatly than in the third preferred embodiment. Depending on the presence of attachment of the cap portion 50 (the click portion) having the flexibility, it is possible to set the closing structure/opening structure in the core assembly 3X comparatively easily.

Furthermore, according to the fourth preferred embodiment, the cap portion 50 can prevent a magnetic flux generated from the main wire 4 from leaking to the outside of the core structure 30D.

Fifth Preferred Embodiment (First Mode)

Figure 12:
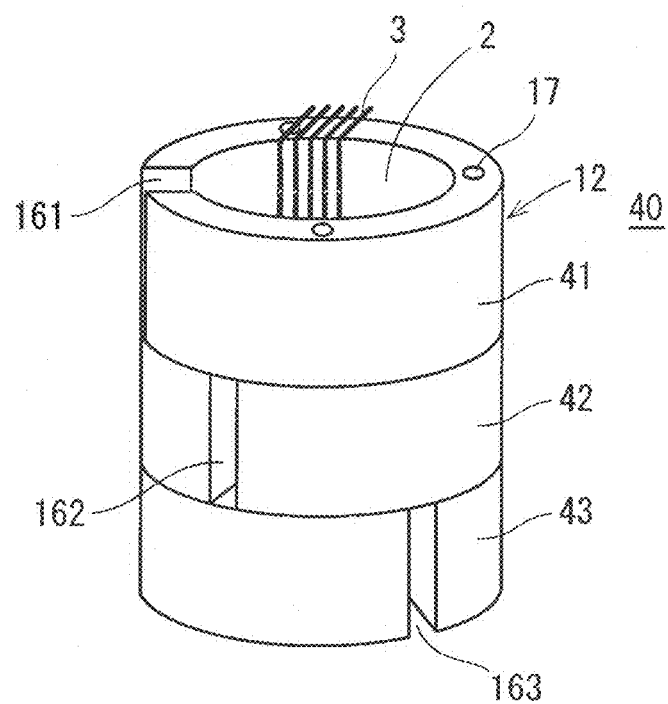
FIG. 12 is an explanatory view (Part 1) showing a wiring core structure according to a first mode of a fifth preferred embodiment of the present invention.
Figure 13:
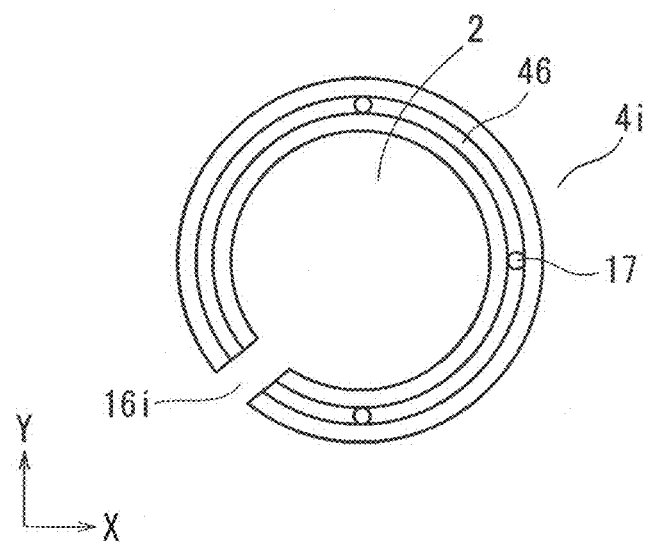
FIG. 13 is an explanatory view (Part 2) showing the wiring core structure according to a first mode of the fifth preferred embodiment of the present invention.

FIGS. 12 and 13 are explanatory views each showing a (wiring) core structure 40 according to a first mode of a fifth preferred embodiment of the present invention, and FIG. 12 is a perspective view showing the whole core structure 40 and FIG. 13 is a perspective view showing a planar structure of a divided core portion $4i$ (i=1 to 3). Herein, FIG. 13 shows an XY rectangular coordinate system.

As shown in these drawings, a core portion in the core structure 40 according to the fifth preferred embodiment is a tubular-shaped core portion obtained by stacking divided core portions 41 to 43 each of which is a plate-shaped core. The divided core portions 41 to 43 are stacked and disposed without clearance between the respective divided core portions in a vertical direction (a Z direction), each have a wiring hole 2, and are made of a soft magnetic material having a high magnetic permeability, for example, ferrite. The respective divided core portions 41 to 43 have planar shapes (sizes of the wiring holes 2 and outside diameters of body portions) set to be identical.

Each of the divided core portions 41 to 43 has the wiring hole 2 for passage of a main wire 4 to be a parasitic-inductance suppression target and has a body portion made of a soft magnetic material in the same manner as in the core structure 300 shown in FIG. 7. Then, the core structure 40 is provided with a wound wire 3 which is formed by winding the wire around the core portion (an assembly of the divided core portions 41 to 43) and has both ends short-circuited.

The divided core portions 41 to 43 in the core structure 40 according to the fifth preferred embodiment have outer-peripheral space parts 161 to 163, provided in the body portion (a substantial part around the wiring hole 2), for inserting the main wire 4 into the wiring hole 2 at a side-surface side of the body portion, and a plurality of (three in the present preferred embodiment) through holes 17, provided in the body portion, for causing a common coupling pin 18 (not shown) to penetrate through the divided core portions 41 to 43.

In the core structure 40, the divided core portions 41 to 43 are stacked and disposed temporarily in such a manner that the outer-peripheral space parts 161 to 163 overlap one another in plan view. Consequently, the main wire 4 can be inserted into the wiring hole 2 through an air gap 16 (see FIGS. 8 to 10) formed on the side surface of the core portion by the outer-peripheral space parts 161 to 163.

Moreover, as shown in FIG. 13, the respective divided core portions $4i$ (i=1 to 3) have a counterbore portion 46 which is recessed from a surface in a circumferential direction of the body portion (the substantial part on the outer periphery of the wiring hole 2), and is provided with the three through holes 17 in a part thereof. When forming an arrangement structure of the outer-peripheral space part in the divided core portion in the following description, it is possible to recognize a position of the through hole 17 comparatively easily by using the counterbore portion 46 as a guide.

As shown in FIG. 12, in the coupling pin insertion state in which three coupling pins 18 are inserted into the three through holes 17 among the divided core portions 41 to 43, it is possible to implement a closing structure in which the main wire 4 inserted in the wiring hole 2 is not removed from the wiring hole 2 to the outside by the arrangement structure of the divided core portions 41 to 43 in which the outer-peripheral space parts 161 to 163 of all the divided core portions 41 to 43 do not overlap one another in plan view.

Herein, the closing structure is implemented by the arrangement structure of the divided core portions 41 to 43 in which at least two outer-peripheral space parts $16i$ (i=1 to 3) in the divided core portions 41 to 43 do not overlap each other in plan view in an XY plane of FIG. 13 in the coupling pin insertion state.

After the closing structure is implemented, both ends are short-circuited by the wound wire 3 wound around the core portion constituted of the divided core portions 41 to 43. Consequently, the core structure 40 according to the fifth preferred embodiment is formed and used.

Thus, in the core structure 40 according to the fifth preferred embodiment, the divided core portions 41 to 43 are disposed temporarily in an opening structure in which the main wire 4 can be inserted into the wiring hole 2 through the air gap 16 defined by the assembly of the outer-peripheral space parts 161 to 163 of the divided core portions 41 to 43 and the main wire 4 is inserted through the air gap 16 into the wiring hole 2 in a previous stage to the coupling pin insertion. Consequently, the main wire 4 can be disposed in the wiring hole 2 comparatively easily.

After the insertion of the main wire 4, the counterbore portion 46 is used as a guide to recognize the position of the through hole 17, and the three coupling pins 18 are inserted into the three through holes 17 to fix the divided core portions 41 to 43, thereby implementing the closing structure. Thus, it is possible to exhibit the inductance suppression effect for the main wire 4 with high stability.

Furthermore, in the core structure 40 according to the first mode of the fifth preferred embodiment, it is possible to recognize the position of the through hole 17 by using the counterbore portion 46 as the guide in each of the divided core portions 41 to 43. Thus, it is possible to change the arrangement of the divided core portions 41 to 43 from the opening structure to the closing structure comparatively easily. As a result, it is possible to simplify a work process.

Moreover, according to the fifth preferred embodiment, it is possible to prevent leakage of a magnetic flux generated from the main wire 4 to the outside and a phenomenon in which a route of a magnetic flux generated in a core assembly 3X is divided between the plurality of divided core portions $4i$ by the arrangement structures of the divided core portions 41 to 43.

Moreover, according to the first mode of the fifth preferred embodiment, it is not necessary to attach the covering members 19A and 19B or the cap portion 50 unlike the third and fourth preferred embodiments. Correspondingly, it is possible to reduce a cost.

(Second Mode)

Figure 14:
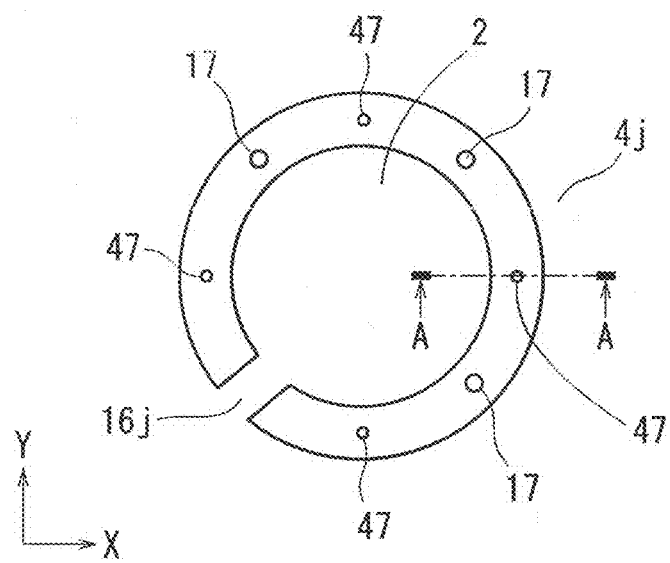
FIG. 14 is an explanatory view showing a divided core portion in a wiring core structure according to a second mode of the fifth preferred embodiment of the present invention.
Figure 15:
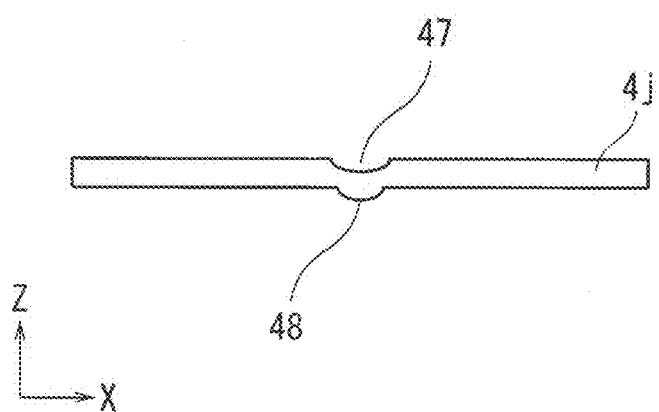
FIG. 15 is a cross-sectional view taken along line A-A in FIG. 14.

FIGS. 14 and 15 are explanatory views each showing a divided core portion $4j$ (j=1 to 3) in a core structure 40 according to a second mode of the fifth preferred embodiment of the present invention, and FIG. 14 is a plan view showing a planar structure of the divided core portion 4*j* and FIG. 15 is a cross-sectional view taken along line A-A in FIG. 14. Herein, FIG. 14 shows an XY rectangular coordinate system and FIG. 15 shows an XZ rectangular coordinate system.

As shown in FIG. 14, the divided core portion 4*j* has an outer-peripheral space part 16*j*, provided in a body portion (a substantial portion around a wiring hole 2), for inserting a main wire 4 into the wiring hole 2 at a side-surface side of the body portion, and three through holes 17 and three recessed portions 47 (recessed surface-positioning portions) which are provided in the body portion and which cause a common coupling pin 18 (not shown) to penetrate through the divided core portions 41 to 43. Furthermore, the divided core portion 4*j* is provided with a projected portion 48 (a projected back-surface-positioning portion) at a back side corresponding to the recessed portion 47 (XY coordinates are coincident with each other) as shown in FIG. 15. The other configurations are the same as those in the first mode shown in FIGS. 12 and 13 except that the counterbore portion 46 is not provided. Differences from the first mode will be mainly described below.

In the second mode, after the main wire 4 is inserted, three projected portions 48 of an upper divided core portion 4*k* (k=1, 2) are fitted in three recessed portions 47 of a lower divided core portion 4(k+1) in each of a pair of divided core portions (divided core portions 41 and 42 and divided core portions 42 and 43) which are adjacent in a vertical direction (a Z direction) in the divided core portions 41 to 43. Consequently, it is possible to position the divided core portions 41 to 43.

After the positioning, the three coupling pins 18 are inserted into the three through holes 17 to fix the divided core portions 41 to 43. Consequently, it is possible to exhibit the inductance suppression effect for the main wire 4 with high stability.

Thus, according to the second mode of the fifth preferred embodiment, the projected portions 48 of the upper divided core portion 4*k* are fitted in the recessed portions 47 of the lower divided core portion 4(k+1) in each of the divided core portions 41 to 43. Consequently, it is possible to change the arrangement of the divided core portions 41 to 43 from an opening structure to a closing structure comparatively easily.

In other words, the recessed portion 47 and the projected portion 48 serve as positioning guides in stacking the divided core portions 41 to 43. The provision of the recessed portion 47 and the projected portion 48 facilitates a work process. Moreover, the recessed portion 47 and the projected portion 48 are also used as positioning guides in shifting the positions of the outer-peripheral space parts 161 to 163 from the opening structure of the divided core portions 41 to 43. For example, in the case where a silicon steel sheet is used for the body portion of the core portion, it is possible to easily make the recessed portion 47 and the projected portion 48 using sheet metal working. Thus, it is also possible to produce an advantage that the recessed portion 47 and the projected portion 48 can be provided at a lower cost than the fabrication of the counterbore portion 46 according to the first mode.

An upper surface of the divided core portion 41 and a lower surface of the divided core portion 43 do not need fitting. For this reason, the formation of both the recessed portion 47 of the divided core portion 41 and the projected portion 48 of the divided core portion 43 may be omitted.

Sixth Preferred Embodiment (First Mode)

Figure 16:
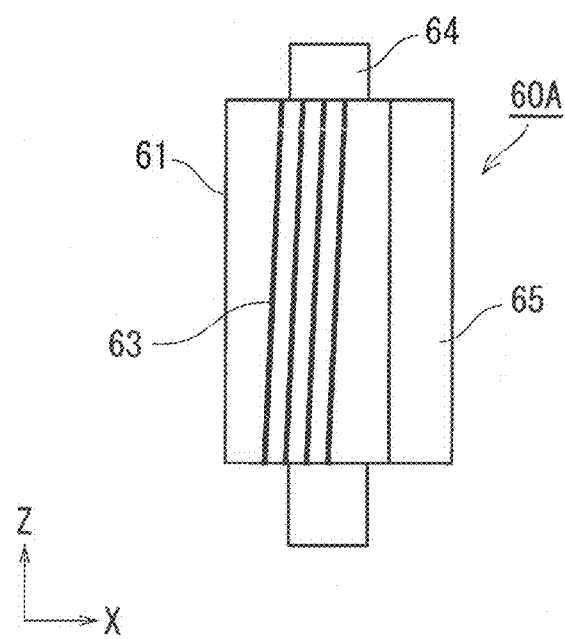
FIG. 16 is an explanatory view (Part 1) showing a wiring core structure according to a first mode of a sixth preferred embodiment of the present invention.
Figure 17:
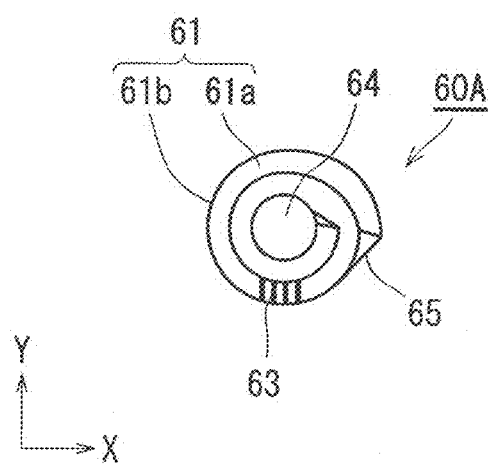
FIG. 17 is an explanatory view (Part 2) showing a wiring core structure according to the first mode of the sixth preferred embodiment of the present invention.
Figure 18:
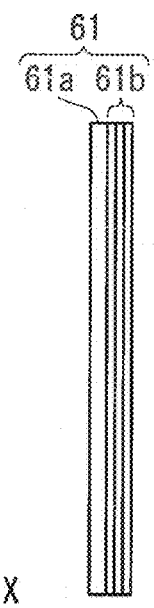
FIG. 18 is an explanatory view (Part 3) showing a wiring core structure according to the first mode of the sixth preferred embodiment of the present invention.

FIGS. 16 to 18 are explanatory views each showing a (wiring) core structure 60A according to a first mode of a sixth preferred embodiment of the present invention, and FIG. 16 is a view showing a structure of a side surface of the core structure 60A in a state of being attached to (wound around) a main wire, FIG. 17 is a plan view showing a planar structure of the core structure 60A and FIG. 18 is an explanatory view showing a configuration of a core portion 61. FIGS. 16 and 18 show an XZ rectangular coordinate system and FIG. 17 shows an XY rectangular coordinate system.

As shown in these drawings, the core portion 61 and a wound wire 63 are provided. The core portion 61 has flexibility and includes at least a part (a laminated portion 61*b*) made of a soft magnetic material. The wound wire 63 is provided on an outer peripheral part of the core portion 61 and has both ends short-circuited. The core portion 61 having the wound wire 63 wound directly plural times is provided on an outer peripheral part of a main wire 64 to be a parasitic-inductance suppression target. Thus, the core structure 60A is obtained.

As shown in FIG. 18, the core portion 61 is constituted of a winding core portion 61*a* made of polyimide having an insulation property and flexibility, and the laminated portion 61*b* obtained by laminating a plurality of core forming layers (core base materials), each of which is made of a soft magnetic material having the flexibility. It is possible to suppress magnetic saturation by laminating the core forming layers.

As shown in FIG. 17, the core portion 61 is directly wound around the outer periphery of the main wire 64 plural times and is thus provided in an outer peripheral part of the main wire 64. In this case, the core portion 61 is wound in such a manner that the winding core portion 61*a* is disposed on an inside (a main wire 64 side) and the laminated portion 61*b* is disposed on the outside (an outer peripheral side).

Furthermore, the core portion 61 has a core extended portion 65 fixed to the main wire 64 side by bending so as to be positioned between an end in an outermost peripheral part of the core portion 61 and an innermost forming part of the core portion 61 provided on an outer peripheral surface of the main wire 64 and in the innermost part. The core extended portion 65 can also be implemented by extending the laminated portion 61*b* from an end of the winding core portion 61*a*, for example.

Thus, the core structure 60A can exhibit the inductance suppression effect by a comparatively easy attachment work in which the core portion 61 having the wound wire 63 wound therearound covers the outer periphery of the main wire 64 to be a parasitic-inductance suppression target.

Further, in the core portion 61, the laminated portion 61*b* made of a soft magnetic material can prevent leakage of a magnetic flux generated from the main wire 64 to the outside of the core structure 60A and leakage of a magnetic flux generated on the outside into an inside (the main wire side) of the core portion 61.

In addition, the core portion 61 is reinforced with the winding core portion 61*a* having an insulating property. Consequently, damage can be suppressed, and furthermore, an insulating property from the main wire 64 can be ensured.

Moreover, the core portion 61 has the winding core portion 61*a* disposed on the main wire 64 side and wound around the main wire 64. Consequently, it is possible to ensure an insulation state between the main wire 64 and the core portion 61.

The winding core portion 61a is made of polyimide. Consequently, it is possible to implement the winding core portion 61a which is excellent in flexibility and the insulating property.

Moreover, the core portion 61 of the core structure 60A is formed by covering the outer periphery of the main wire 64 plural times. Thus, it is possible to effectively suppress a phenomenon in which the core portion causes magnetic saturation.

Furthermore, after the main wire 64 is disposed, the core portion 61 is wound around the main wire 64 in close contact therewith. Consequently, the core structure 60A can be disposed in a desirable position comparatively easily.

For example, in the case where a bulk-shaped parasitic inductance suppressing core is utilized for the main wire 64 which has already been connected to a device, it is necessary to once remove one of ends of a cable serving as the main wire 64 from the device, and to insert the end through the bulk-shaped core. For this reason, workability is poor.

On the other hand, in the case where the core structure 60A is used, the core portion 61 made of a soft magnetic material having flexibility is wound around the main wire 64 to be a primary cable and is thus attached thereto, and a distal end is processed (the core extended portion 65 is bent or a covering member 66 according to a second mode which will be described below is formed). Consequently, the workability can be improved remarkably.

Furthermore, the core extended portion 65 is fixed by an inner peripheral part of the core portion 61, thereby preventing clearance from being generated on an outermost peripheral tip part of the core portion 61. Consequently, it is possible to prevent division of a route of a magnetic flux generated in the core portion 61.

(Second Mode)

Figure 19:
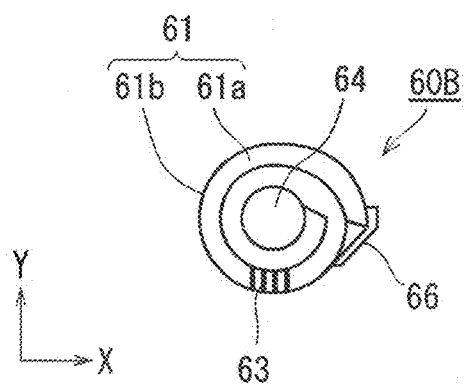
FIG. 19 is a plan view showing a wiring core structure according to a second mode of the sixth preferred embodiment in accordance with the present invention.

FIG. 19 is a plan view showing a (wiring) core structure 60B according to a second mode of the sixth preferred embodiment of the present invention. As shown in FIG. 19, the core structure 60B features that a covering member 66 made of a soft magnetic material having a high magnetic permeability is formed by covering an end of an outermost peripheral part in a core portion 61 (a laminated portion 61b) and a periphery thereof in place of the core extended portion 65. Since the other structures are the same as those in the first mode shown in FIGS. 16 to 18, description thereof will be omitted.

The core structure 60B is provided with the covering member 66 to reliably prevent clearance from being generated on a tip of the outermost peripheral part in the core portion 61. Consequently, it is possible to prevent leakage of a magnetic flux to the outside, thereby hindering a route of a magnetic flux generated in the core portion 61 from being divided.

The covering member 66 is fixed by a method such as bonding. However, the present invention is not restricted to these techniques. A sheet-like magnetic shield material may be stuck as the covering member 66 or wound around the whole outer peripheral part of the core portion 61.

Also in the second mode, the core extended portion 65 may further be provided to enhance an effect for preventing leakage of a magnetic flux to the outside and division of a magnetic flux route still more in the same manner as in the first mode.

(Third Mode)

Figure 20:
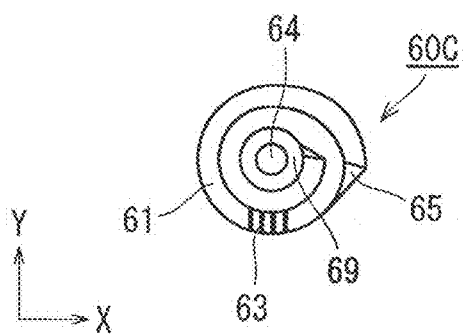
FIG. 20 is a plan view showing a planar structure of a wiring core structure according to a third mode of the sixth preferred embodiment of the present invention.

FIG. 20 is a plan view showing a planar structure of a (wiring) core structure 60C according to a third mode of the sixth preferred embodiment of the present invention. As shown in FIG. 20, a core portion 61 is wound around a main wire 64 with a space region 69 provided between the core portion 61 and the main wire 64. The other configurations are the same as those in the first mode shown in FIGS. 16 to 18.

In the core structure 60C according to the third mode, the space region 69 is ensured between the core portion 61 and the main wire 64. Thus, it is possible to produce an advantage that a movement thereof can be carried out comparatively easily after attachment of the core structure 60C.

Although the core portion 61 is constituted of the winding core portion 61a and the laminated portion 61b in the first to third modes of the sixth preferred embodiment shown in FIGS. 16 to 20, the core portion 61 may be constituted of only the laminated portion 61b.

Seventh Preferred Embodiment

Figure 21:
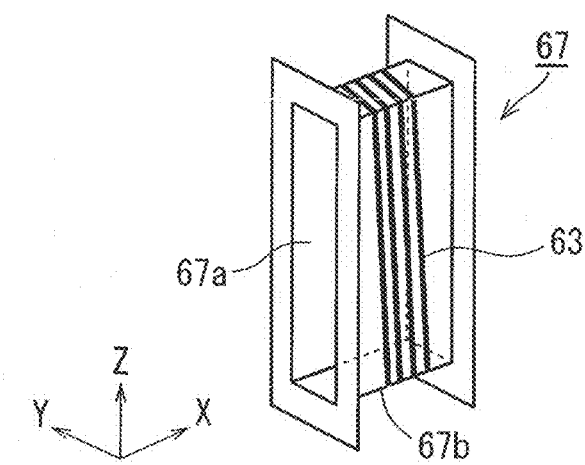
FIG. 21 is an explanatory view (Part 1) showing a wiring core structure according to a seventh preferred embodiment of the present invention.
Figure 22:
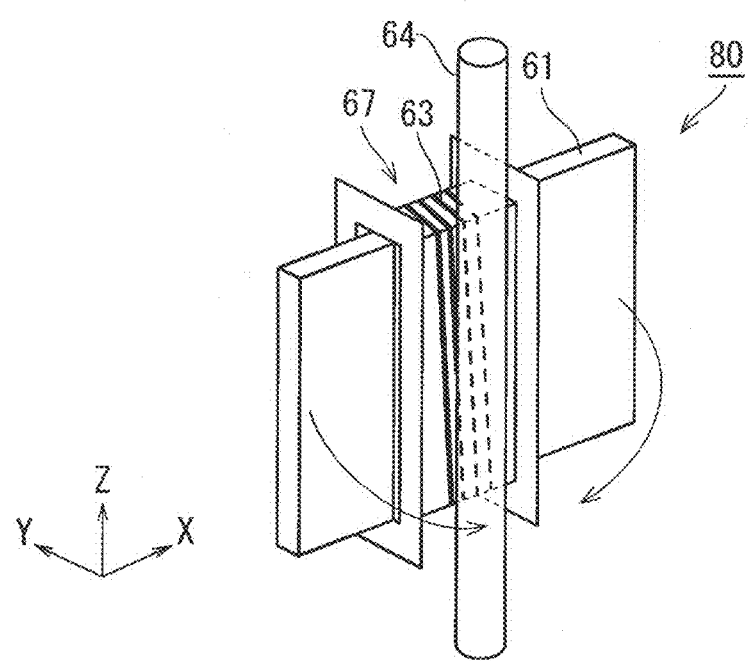
FIG. 22 is an explanatory view (Part 2) showing the wiring core structure according to the seventh preferred embodiment of the present invention.

FIGS. 21 and 22 are explanatory views each showing a (wiring) core structure 80 according to a seventh preferred embodiment of the present invention. FIG. 21 is a perspective view showing a bobbin 67 in a core structure 80 and FIG. 22 is a perspective view showing the whole configuration of the core structure 80. FIGS. 21 and 22 show an XYZ rectangular coordinate system.

As shown in FIG. 21, the bobbin 67 is constituted of a hollow portion 67a and a body portion 67b, a core portion 61 can be inserted into the hollow portion 67a, and a wound wire 63 is wound around an outer periphery of the body portion 67b having flexibility and made of an insulating material.

As shown in FIG. 22, the core portion 61 is inserted into the hollow portion 67a of the bobbin 67, thereby forming the core structure 80. In the core structure 80, the core portion 61 including the bobbin 67 is bent and wound directly around an outer periphery of a main wire 64 plural times. Thus, the outer periphery of the main wire 64 can be covered. As a mode for providing the core portion 61 on the outer peripheral part of the main wire 64, it is also possible to use any of the first to third modes according to the sixth preferred embodiment.

Thus, the core structure 80 according to the seventh preferred embodiment is different from that in the sixth preferred embodiment in that the wound wire 63 is not directly wound around the core portion 61 but the wound wire 63 is wound around the bobbin 67 made of the insulating material and the core portion 61 and the bobbin 67 are integrated with each other. In other words, the wound wire 63 is indirectly provided on the outer peripheral part of the core portion 61 by way of the bobbin 67.

In respect of a process, it is not easy to wind a cable serving as the wound wire 63 while holding the core portion 61 made of a material having flexibility, thereby forming a dense and stable coil in a predetermined direction. Thus, as in the seventh preferred embodiment, the wound wire 63 is wound around the bobbin 67 and then the core structure 80 including the bobbin 67 and the core portion 61 is disposed with respect to the main wire 64.

Thus, with the core structure 80 according to the seventh preferred embodiment, the bobbin 67 is used for winding the wound wire 63. Consequently, it is possible to produce an advantage that the wound wire 63 can be disposed on the core portion 61 comparatively easily.

In addition, with the core structure 80 according to the seventh preferred embodiment, the placement can easily be carried out, and furthermore, the wound wire 63 can readily be changed and attached/removed over the bobbin 67 when the winding number of the wound wire 63 is to be varied.

Although the body portion 67b of the bobbin 67 is desirably made of engineering plastic which is excellent in environment resistance, the present invention is not restricted thereto.

Eighth Preferred Embodiment

Figure 23:
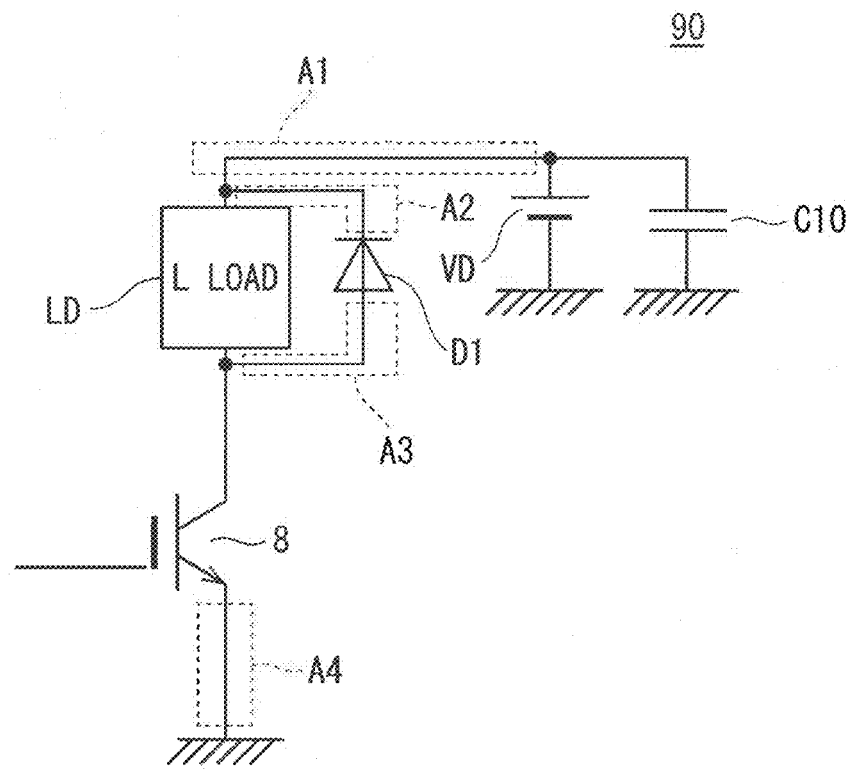
FIG. 23 is a circuit diagram showing a circuit configuration of a semiconductor evaluation device according to an eighth preferred embodiment of the present invention.

FIG. 23 is a circuit diagram showing a circuit configuration of a semiconductor evaluation device according to an eighth preferred embodiment of the present invention. As shown in FIG. 23, a switching characteristic evaluation circuit 90 is constituted of a diode D1, an L load portion LD, a power supply VD and a capacitor C10, and one of electrodes of a capacitor C10, a cathode of the diode D1, and one of ends of the L load portion LD are connected to a positive electrode of the power supply VD. A collector of an IGBT 8 (measurement target element) to be a switching element of a switch characteristic evaluation target is connected to an anode of the diode D1 and the other end of the L load portion LD. An emitter of the IGBT 8 and the other electrode of the capacitor C10 are grounded.

The switching characteristic evaluation circuit 90 thus configured has a measuring function capable of evaluating a switching characteristic of the IGBT 8 (particularly, in an OFF state) by measuring a current flowing to the IGBT 8 through the L load portion LD.

When exhibiting the measuring function, the switching characteristic evaluation circuit 90 sets, as a core structure arrangement region A1, a wiring region between the positive electrode of the power supply VD and one of the ends of the L load portion LD; as a core structure arrangement region A2, a wiring region between one of the ends of the L load portion LD and the anode of the diode D1; as a core structure arrangement region A3, a wiring region between the other end of the L load portion LD and the cathode of the diode D1; and as a core structure arrangement region A4, a wiring region (a wiring portion of the measurement target element) between the emitter of the IGBT 8 and the ground.

The switching characteristic evaluation circuit 90 sets a wiring portion in at least one of the core structure arrangement regions A1 to A4 as a main wire 4 (64) and places any of the wiring core structures according to the first to seventh preferred embodiments, thereby enhancing the inductance suppression effect. Thus, it is possible to measure the switching characteristic (an operating characteristic) of the IGBT 8 with high precision.

Furthermore, by reducing a parasitic L of the wiring portion provided with the wiring core structure, it is possible to lessen an induced current flowing to the other part by inductive coupling to the parasitic L of the wiring portion. As a result, it is possible to realize energy saving of the switching characteristic evaluation circuit 90.

In addition, the parasitic L of the wiring portion provided with the wiring core structure is reduced to decrease a surge voltage so that a device is prevented from being destroyed by the surge voltage. Consequently, it is possible to enhance a yield of the switching characteristic evaluation circuit 90.

Ninth Preferred Embodiment

Figure 24A:
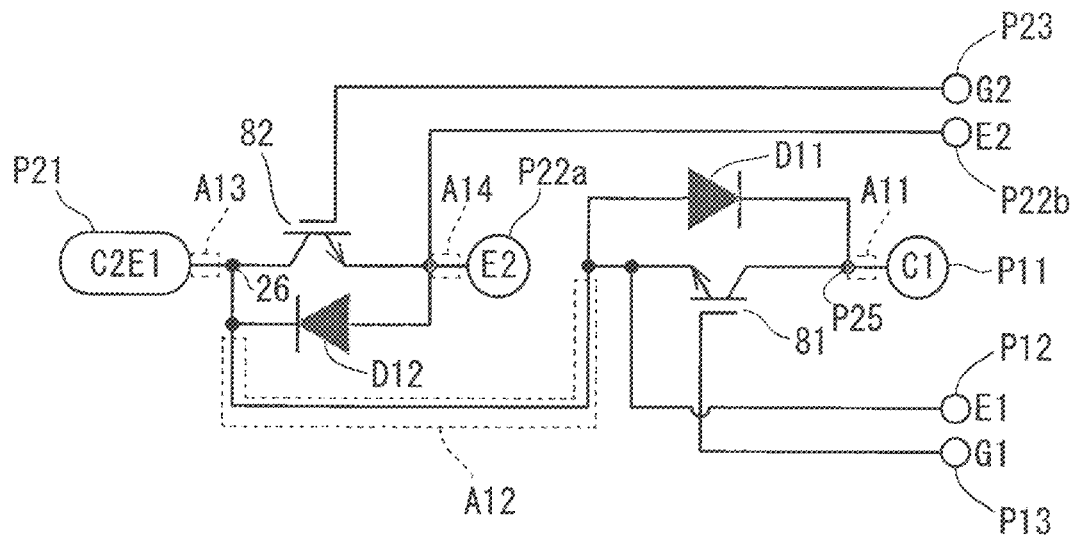
FIGS. 24A and 24B are explanatory views showing a circuit configuration of an IGBT module according to a ninth preferred embodiment of the present invention.
Figure 24B:
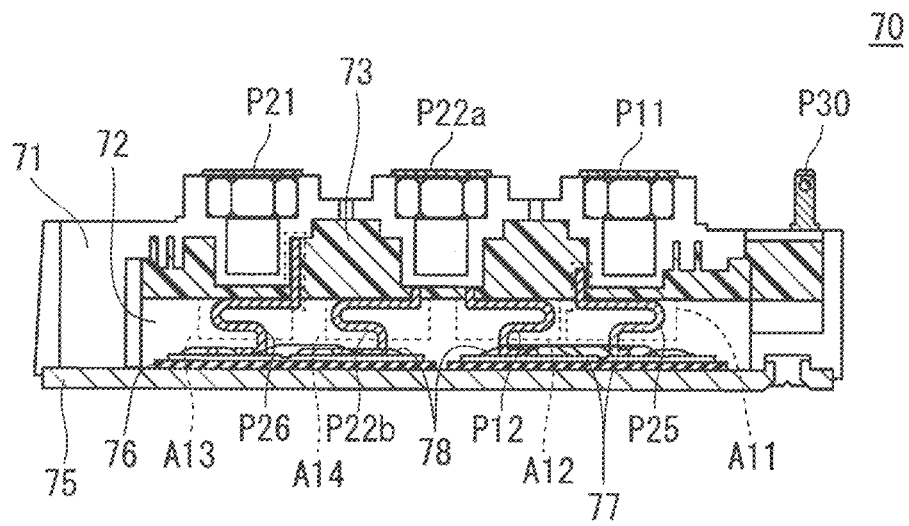

FIGS. 24A and 24B are explanatory diagrams showing an IGBT module 70 according to a ninth preferred embodiment of the present invention, and FIG. 24A shows a circuit configuration of the IGBT module 70 and FIG. 24B shows a device structure of the IGBT module 70.

As shown in FIG. 24A, diodes D11 and D12 are connected in parallel with IGBTs 81 and 82 with an emitter side set to be an anode. An emitter of the IGBT 81 (an anode of the diode D11) and a collector of the IGBT 82 (a cathode of the diode D12) are electrically connected to each other.

The IGBT 81 has a collector electrode P11 (C1), an emitter electrode P12 (E1) and a gate electrode P13 (G1). Similarly, the IGBT 82 has a collector electrode P21 (C2E1), an emitter electrode P22 (P22a, P22b) (E2) and a gate electrode P23 (G2).

In the circuit shown in FIG. 24A, a wiring region between the collector electrode P11 and an internal collector electrode portion P25 (in the vicinity of a cathode connection point of the diode D11) is set as a core structure arrangement region A11, a wiring region between the emitter of the IGBT 81 and the collector of the IGBT 82 is set as a core structure arrangement region A12, a wiring region between the collector electrode P21 and an internal collector electrode portion P26 of the IGBT 82 is set as a core structure arrangement region A13, and a wiring region between the emitter electrode P22a and the emitter electrode P22b of the IGBT 82 is set as a core structure arrangement region A14.

On the other hand, as shown in FIG. 24B, the IGBT module 70 is configured to accommodate a plurality of silicon chips 77 disposed on a metal pattern (not shown) of a surface of an insulating (ceramic) substrate 76 through the insulating substrate 76 on a copper base plate 75 in a silicone gel portion 72 and a (epoxy) resin sealing portion 73 in a case 71. The silicon chips 77 or the silicon chip 77 and a metal pattern are connected electrically by an aluminum wire 78.

In addition, in FIG. 24B, the collector electrode P21, the emitter electrode P22a and the collector electrode P11, and an auxiliary terminal P30 are provided as an external connecting electrode of the IGBT module 70 in an upper part of the case 71. The collector electrode portion P26 and the emitter electrode P22b in the IGBT 82 and the emitter electrode P12 and the collector electrode portion P25 in the IGBT 81 are provided as electrodes (portions) having bent parts on the corresponding silicon chips 77. With the configurations, the circuit shown in FIG. 24A is implemented.

Accordingly, in the IGBT module 70, the wiring portions of the collector electrode portion P26, the emitter electrode P22b, the emitter electrode P12 and the collector electrode portion P25 included in the core structure arrangement regions A13, A14, A12 and A11 shown in FIG. 24B are set as a main wire 4 (a main wire 64), and any of the wiring core structures described in the first to seventh preferred embodiments is provided to enhance an inductance suppression effect. Consequently, an operating characteristic can be enhanced.

Furthermore, by reducing a parasitic L of the wiring portion provided with the wiring core structure, it is possible to lessen an induced current flowing to the other part by inductive coupling to the parasitic L of the wiring portion. As a result, it is possible to realize energy saving of the IGBT module 70.

In addition, the parasitic L of the wiring portion provided with the wiring core structure is reduced to decrease a surge voltage so that a device is prevented from being destroyed by the surge voltage. Consequently, it is possible to enhance a yield of the IGBT module 70.

While the invention has been shown and described in detail, the foregoing description is in all aspects illustrative and not restrictive. It is therefore understood that numerous modifications and variations can be devised without departing from the scope of the invention.

What is claimed is:

1. A wiring core structure comprising:

a tubular-shaped core portion having a wiring hole for passage of a main wire to be a parasitic-inductance suppression target and having a body portion made of a soft magnetic material; and a wound wire formed by winding a wire around said core portion and having both ends short-circuited, wherein said core portion includes a plurality of divided core portions which are disposed in a superposed relation and each have a wiring hole, and said plurality of divided core portions are formed such that shapes of said wiring holes and outside diameters of said body portions are different from each other and said wound wire is separately wound about all exterior surfaces of each divided core portion, thereby implementing a superposition structure without overlapping in plan view.

2. A semiconductor evaluation device having a measuring function for connecting a measurement target element to measure a characteristic of said measurement target element, said device comprising:

a power supply;

an L load portion; and the wiring core structure according to claim 1, wherein said wiring core structure is provided by setting, as a main wire, at least one of a plurality of wiring portions including between said power supply and said L load portion, between said L load portion and said measurement target element, and between said power supply and said measurement target element.

3. A semiconductor device comprising:

a plurality of elements; and the wiring core structure according to claim 1, wherein said wiring core structure is provided by setting, as a main wire, at least one of said plurality of wiring portions between said plurality of elements.

* * * * *